United States Patent
Choi et al.

(10) Patent No.: US 6,735,084 B1
(45) Date of Patent: May 11, 2004

(54) HEAT SINK FOR ELECTRONIC DEVICES, AND CIRCUIT BOARD AND PLASMA DISPLAY PANEL ASSEMBLY EACH EQUIPPED WITH THE HEAT SINK

(75) Inventors: Soo Yong Choi, Seoul (KR); Jae Man Joo, Kyungki-Do (KR); Seok Yeong Lee, Kyungki-Do (KR); Jung Hun Kang, Seoul (KR); Sang Kyoung Oh, Kyungki-Do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/435,565

(22) Filed: May 12, 2003

(30) Foreign Application Priority Data

Nov. 1, 2002 (KR) .......................... 2002-67517

(51) Int. Cl.[7] .................................. H05K 7/20
(52) U.S. Cl. ..................... 361/704; 361/709; 361/719; 257/706; 257/712; 174/16.1; 174/16.3; 165/80.2; 165/80.3; 165/185
(58) Field of Search ................................. 361/704, 707, 361/709, 719; 257/706, 712; 174/16.1, 16.3; 165/80.2, 80.3, 185

(56) References Cited

U.S. PATENT DOCUMENTS

| | | | | |
|---|---|---|---|---|
| 5,343,362 A | * | 8/1994 | Solberg ...................... 361/710 |
| 5,775,418 A | * | 7/1998 | Lonergan et al. .......... 165/80.2 |
| 5,815,371 A | * | 9/1998 | Jeffries et al. ............... 361/704 |
| 5,958,556 A | * | 9/1999 | McCutcheon ............... 428/172 |
| 5,991,151 A | * | 11/1999 | Capriz ......................... 361/704 |
| 5,999,405 A | * | 12/1999 | Zappacosta et al. ........ 361/704 |
| 6,304,449 B1 | * | 10/2001 | Zhang ......................... 361/704 |
| 2002/0141161 A1 | * | 10/2002 | Matsukura et al. ......... 361/713 |
| 2002/0145854 A1 | * | 10/2002 | Lin ............................. 361/719 |

* cited by examiner

Primary Examiner—Boris Chérvinsky
(74) Attorney, Agent, or Firm—Sughrue Mion, PLLC

(57) ABSTRACT

A heat sink for electronic devices, and circuit board and plasma display panel assembly, each equipped with the heat sink. The heat sink for electronic devices, and circuit board and PDP assembly each equipped with the heat sink includes a base portion fixedly attached to a circuit board, a contact portion fixedly and tightly brought into contact with one or more electronic devices, and a plurality of heat radiation fins each extended from the contact portion to a certain distance. A heat radiation fin distant from the base portion has a width shorter than of a heat radiation fin nearer to the base portion.

21 Claims, 8 Drawing Sheets

HEAT SINK FOR ELECTRONIC DEVICES, AND CIRCUIT BOARD AND PLASMA DISPLAY PANEL ASSEMBLY EACH EQUIPPED WITH THE HEAT SINK

CROSS-REFERENCE TO RELATED APPLICATIONS

This application claims the benefit of Korean Application No. 2002-67517, filed Nov. 1, 2002, in the Korean Intellectual Property Office, the disclosures of which are incorporated herein by reference.

BACKGROUND OF THE INVENTION

1. Field of the Invention

The present invention relates generally to a heat sink for electronic devices, and circuit board and plasma display panel assembly, each equipped with the heat sink, and more particularly to a heat sink for electronic devices, and circuit board and plasma display panel assembly each equipped with the heat sink that is capable of reducing noise.

2. Description of the Related Art

In general, a circuit board, which is installed in various electronic apparatuses, is equipped with a plurality of electronic devices and performs programmed operations through the interaction with these electronic devices.

These electronic devices are supplied with electric power and perform predetermined operations. Some of these electronic devices generate heat and vibration according to their operational characteristics during operation.

The electronic devices that generate heat and vibration are exemplified by a Metal-Oxide Semiconductor Field Effect Transistor (MOSFET).

The MOSFET is applied to a Plasma Display Panel (PDP) to discharge electricity in each of the cells of the PDP. The MOSFET generates heat while switching on/off voltage supplied to each of the cells of the PDP.

FIG. 1 is a view showing a MOSFET 2 and a conventional heat sink 3 for electronic devices that are fixedly attached to a circuit board 1.

As illustrated in FIG. 1, the conventional heat sink 3 for electronic devices includes a base portion 3a fastened to the circuit board 1, a contact portion 3b extended from the base portion 3a and brought into contact at one side thereof with the MOSFET 2, and a plurality of heat radiation fins 3c that are extended from the contact portion 3b to be regularly spaced apart from each other.

Accordingly, heat is transmitted to the heat radiation fins 3c through the contact portion 3b of the heat sink 3, and radiated to the air through the heat radiation fins 3c.

Electromagnetic force is generated in the MOSFET 2 when the MOSFET 2 switches on the voltage, while electromagnetic force is eliminated when the MOSFET 2 switches off the voltage. Accordingly, when the MOSFET 2 is turned on/off to perform this switching operation, electromagnetic force is repeatedly generated and extinguished, thereby vibrating the MOSFET 2.

When the MOSFET 2 vibrates, a vibration is transmitted to the heat sink 3 that is used to cool the MOSFET 2. The transmitted vibration vibrates the plurality of heat radiation fins 3c of the heat sink 3, and consequently generates noise. Since the heat radiation fins 3c vibrate in proportion to the distance from the base portion 3a fastened to the circuit board 1, the heat radiation fins 3c generate noise in proportion to their distance from the base portion 3a.

In particular, where the conventional heat sink for electronic devices is applied to a television set of a home theater system and generates excessive noise, users may complain about the excessive noise of products.

SUMMARY OF THE INVENTION

Accordingly, it is an aspect of the present invention to provide a heat sink for electronic devices, and circuit board and plasma display panel assembly, each equipped with the heat sink, which is capable of reducing noise.

Additional aspects and advantages of the invention will be set forth in part in the description that follows and, in part, will be obvious from the description, or may be learned by practice of the invention.

The foregoing and other aspects of the present invention are achieved by providing a heat sink for electronic devices, and circuit board and PDP assembly, each equipped with the heat sink, including a base portion fixedly attached to a circuit board, a contact portion fixedly and tightly brought into contact with one or more electronic devices, and a plurality of heat radiation fins each extended from the contact portion to a certain distance; and wherein a heat radiation fin distant from the base portion has a width shorter than that of a heat radiation fin nearer to the base portion.

A second aspect of the present invention is that one of the plurality of heat radiation fins may be fixedly attached to the circuit board and constitute the base portion.

A third aspect of the present invention is that the contact portion may be extended from the base portion to form a certain angle with the base portion, and the plurality of heat radiation fins may be extended from the contact portion parallel to the base portion.

A fourth aspect of the present invention is that a heat radiation fin spaced from the base portion by more than a predetermined distance may have a width shorter than that of a heat radiation fin situated within the predetermined distance.

A fifth aspect of the present invention is that the plurality of heat radiation fins each may have a width inversely proportional to a distance thereof from the base portion.

A sixth aspect of the present invention is that the electronic devices may be MOSFETs.

BRIEF DESCRIPTION OF THE DRAWINGS

These and other aspects and advantages of the invention will become apparent and more readily appreciated from the following description of the exemplary embodiments, taken in conjunction with the accompanying drawings of which.

DETAILED DESCRIPTION OF THE INVENTION

Figure 1:
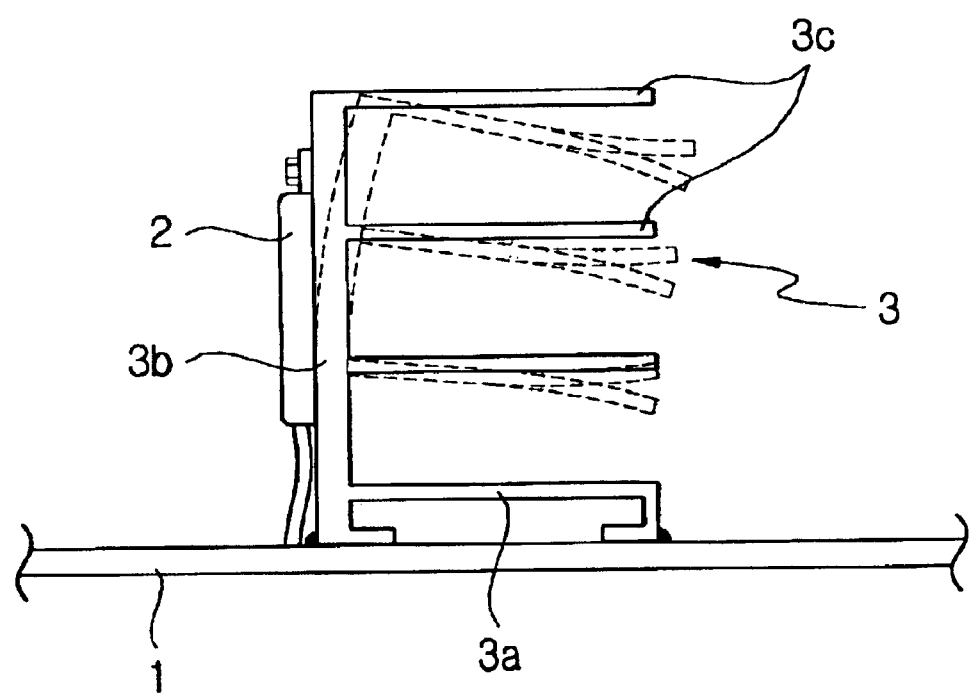
FIG. 1 is a plan view showing a conventional heat sink for electric devices and a circuit board equipped with the conventional heat sink.

Reference will now be made in detail to illustrative, non-limiting embodiments of the present invention, which are illustrated in the accompanying drawings, wherein like reference numerals reer to like elements throughout.

Figure 2:
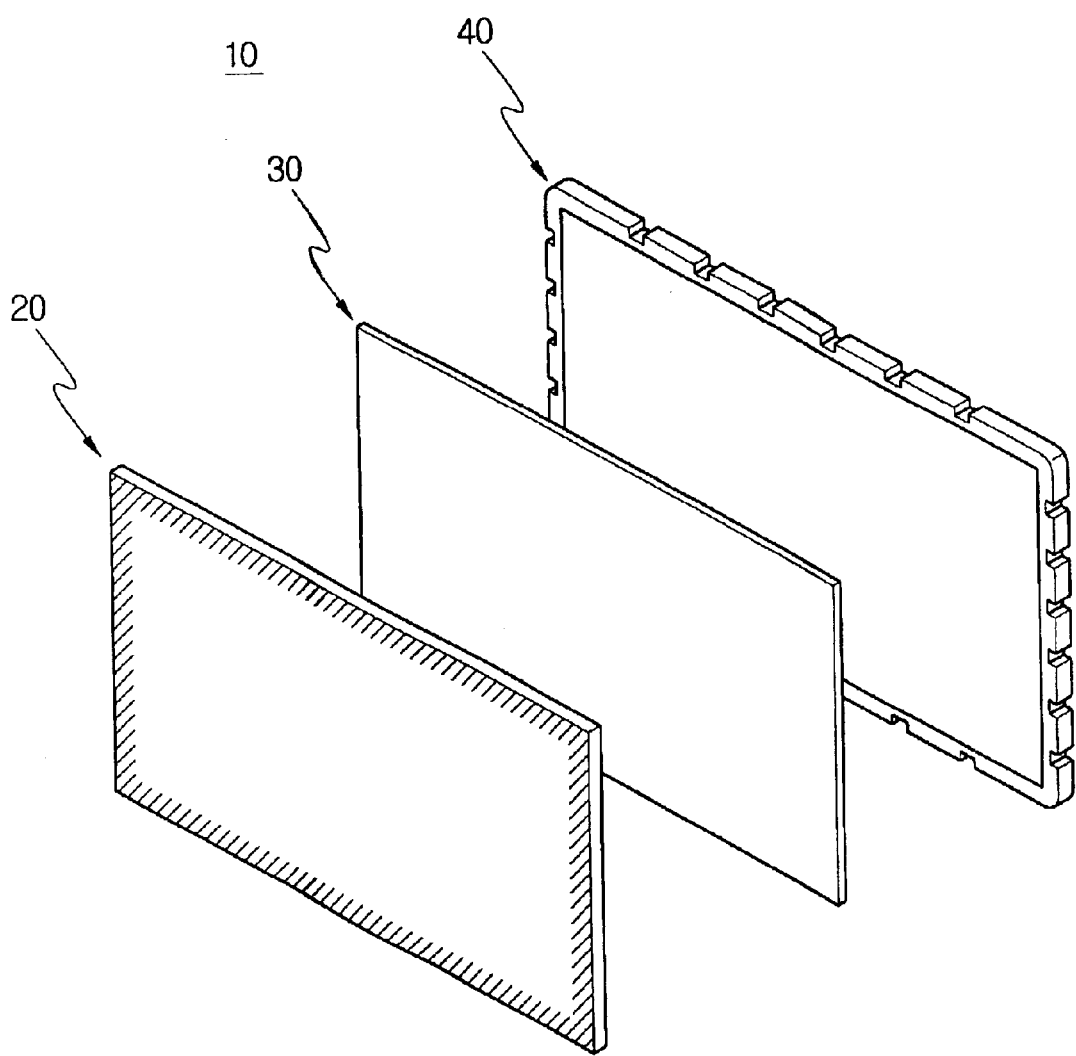
FIG. 2 is an exploded perspective view of a PDP assembly according to an exemplary embodiment of the present invention.

FIG. 2 is an exploded perspective view of a PDP assembly according to an illustrative, non-limiting embodiment of the present invention.

The PDP assembly 10 of the present invention includes a PDP 20 on which images are displayed, a base panel 40 in front of which the PDP 20 is disposed, and a sheet 30 which is disposed between the PDP 20 and the base panel 40 to transfer heat.

Figure 3:
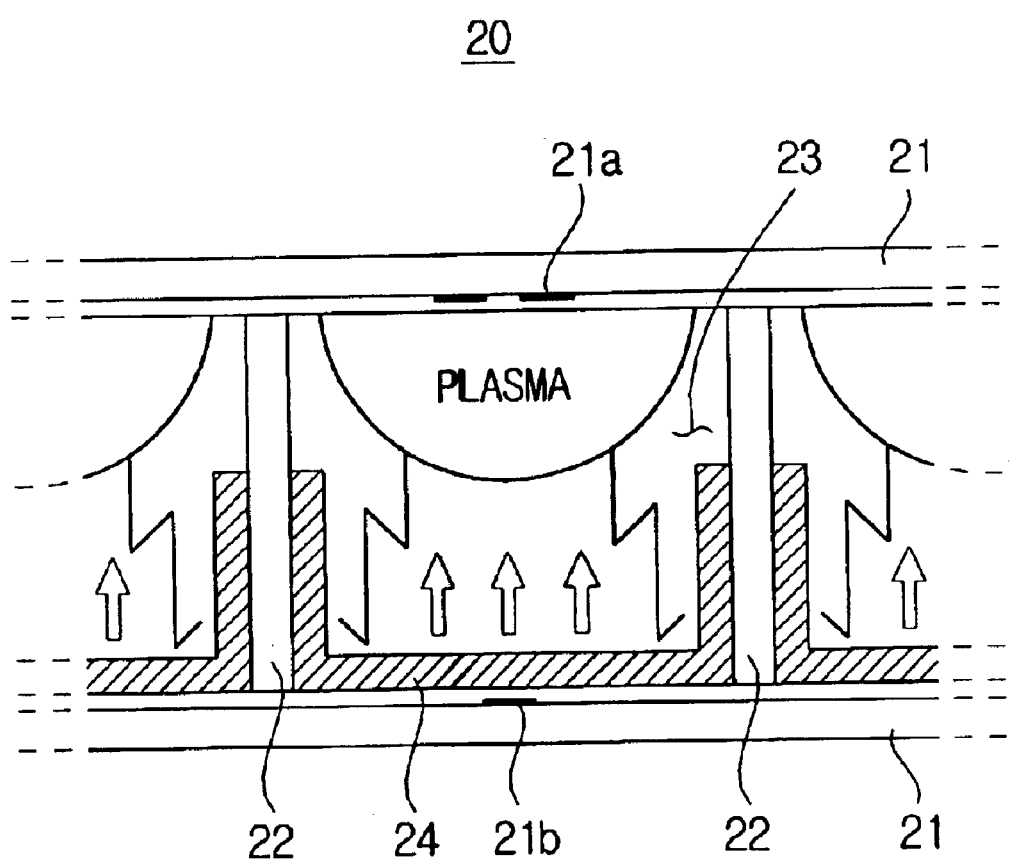
FIG. 3 is a sectional view of a PDP according to an exemplary embodiment of the present invention.

As illustrated in FIG. 3, in the PDP 20, a plurality of partition walls 22 are regularly formed between a pair of glass substrates 21 provided with an X electrode 21a and a Y electrode 21b, respectively, to form a plurality of pixels 23, and each of the pixels 23 is sealed with the interior thereof being filled with high pressure electric discharge gas. Each pixel 23 is provided with a fluorescent material 24 that emits one of red, green and blue visible light when ultraviolet rays are irradiated to the pixel 23. Accordingly, when voltage is applied between the X electrode 21a and the Y electrode 21b, plasma discharge is performed through the electric discharge gas in the pixel 23, and ultraviolet rays are generated. The generated ultraviolet rays collide with the fluorescent material 24, and consequently visible rays are generated by the collision between the ultraviolet rays and the fluorescent material 24.

Figure 4:
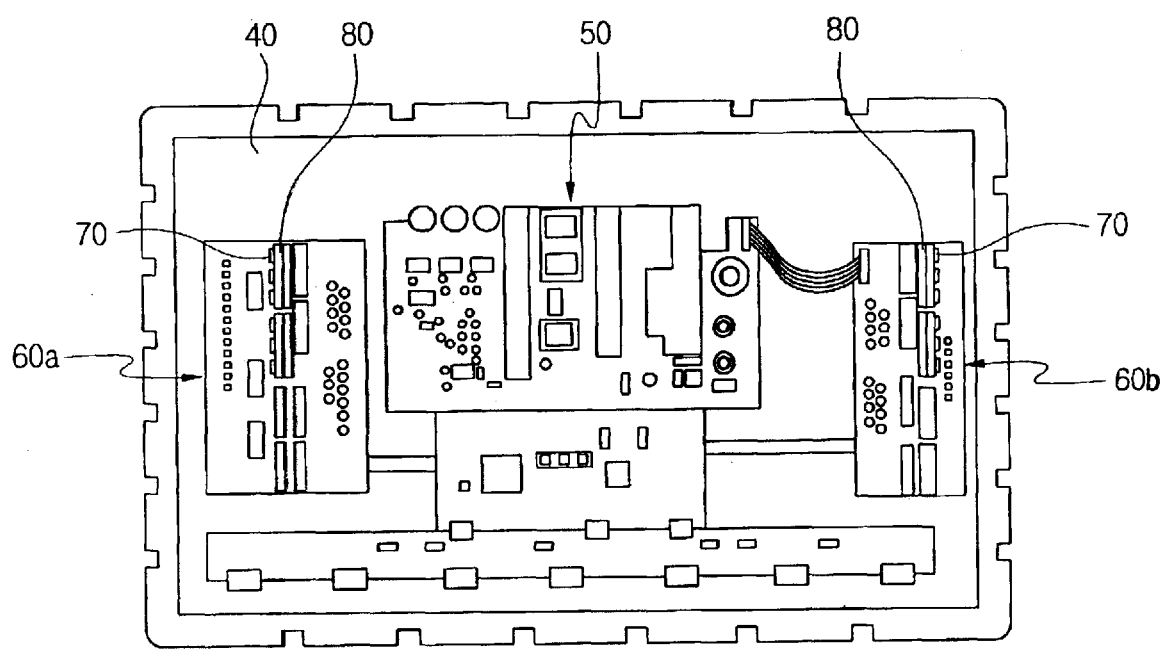
FIG. 4 is a rear view of a base panel according to an exemplary embodiment of the present invention.

Referring to FIG. 4, a variety of electronic devices are mounted on the back of the base panel 40 to apply voltage to each pixel 23. For the electronic devices mounted on the back of the base panel 40, there are a Switched Mode Power Supply (SMPS) 50 that supplies power to the PDP assembly 10 and circuit boards 60a and 60b that control display by selectively applying and removing voltage between the X electrode 21a and the Y electrode 21b.

In this case, the circuit boards 60a and 60b include an X circuit board 60a that applies voltage to the X electrode 21a of each pixel 23 and a Y circuit board 60b that applies voltage to the Y electrode 21b of each pixel 23.

Figure 5:
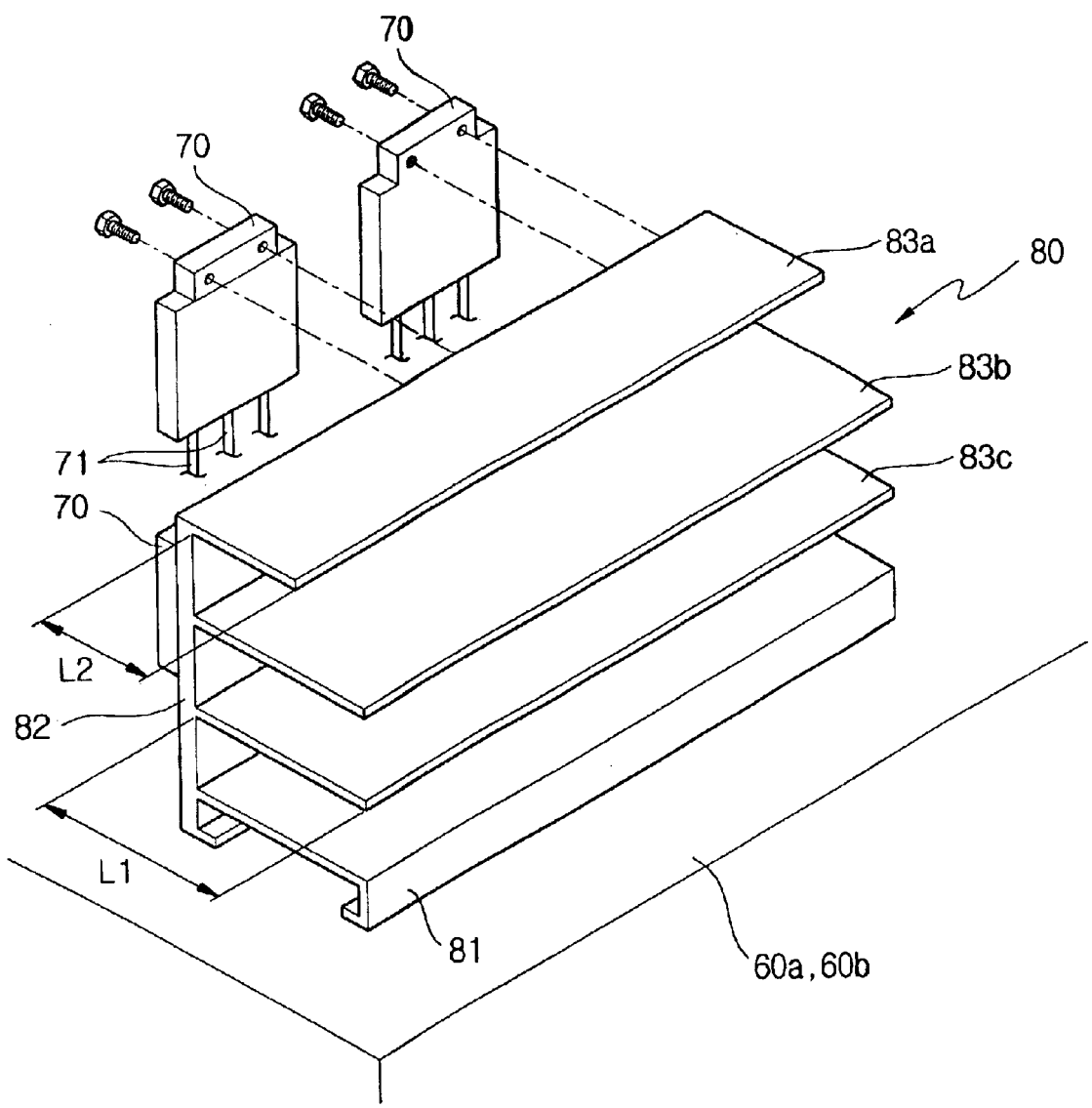
FIG. 5 is a perspective view showing a heat sink and a circuit board equipped with the heat sink according to exemplary embodiment of the present invention.

As shown in FIG. 5, a MOSFET 70 is substantially fabricated in the form of a plate. A plurality of connection lines 71 are extended from the MOSFET 70 to be connected to circuit bands 60a and 60b. The wide surface of the MOSFET 70 is tightly attached to a heat sink 80 by a fastening means such as a screw so that heat generated in the MOSFET 70 is transferred to and radiated through the heat sink 80.

The heat sink 80 is fixedly attached to the circuit boards 60a and 60b. The heat sink 80 includes a base portion 81 fastened to the circuit boards 60a and 60b, a contact portion 82 upwardly extended from the base portion 81 and brought into contact at one side thereof with the MOSFET 70 to receive heat generated in the MOSFET 70, and a plurality of heat radiation fins 83a, 83b and 83c extended from the contact portion 82 to a certain extent, in parallel with the base portion 81 to radiate heat.

The base portion 81 of the heat sink 80 is fixedly attached to the circuit boards 60a and 60b and additionally serves as a heat radiation fin.

The heat radiation fins 83a, 83b and 83c are fabricated in the form of a plate. The plurality of heat radiation fins 83a, 83b and 83c are arranged in parallel with each other in a vertical direction, and spaced apart from each other by a certain interval to desirably radiate heat. In this illustrative, non-limiting embodiment, the number of the heat radiation fins 83a, 83b and 83c is three.

In this case, the uppermost heat radiation fin of the three heat radiation fins 83a, 83b and 83c is designed to have a width L2 that is smaller than the width L1 of the central and lowermost heat radiation fins of the three heat radiation fins 83a, 83b and 83c.

The vibration of a heat radiation fin 83a, 83b or 83c can be increased in proportion to the distance thereof from the base portion 81. Additionally, if the heat radiation fins 83a, 83b or 83c vibrate with an amplitude that is greater than a certain amplitude, air is vibrated and noise is generated. Accordingly, when the width of the uppermost heat radiation fin 83a is designed smaller than each of the other heat radiation fins 83b and 83c, the vibration magnitude of the uppermost heat radiation fin 83a is reduced to a value that is similar to the vibration magnitude value for each of the central and lowermost heat radiation fins 83b and 83c.

The widths of the central and lowermost heat radiation fins 83b and 83c are designed to be the same. The central and lowermost heat radiation fins 83b and 83c vibrate with amplitudes that are smaller than the vibration amplitude of the uppermost heat radiation fin 83c. Therefore, the central and lowermost heat radiation fins 83b and 83c do not generate noise. Additionally, they are designed to have the same width in consideration of ease of fabrication.

In this illustrative, non-limiting embodiment, the expressions "upper" and "lower" are used to represent the relative positions of the elements, but are not used to limit the configuration of the heat sink 80 in detail.

Additionally, although in this illustrative, non-limiting embodiment the number of the heat radiation fins 83a, 83b and 83c has been described as being three, the number of the heat radiation fins is not limited to three. Accordingly, after the number of the heat radiation fins is determined depending upon the overall design of the heat sink, the widths of the heat radiation fins may be determined to allow each of the vibration amplitudes of the heat radiation fins to be less than a certain level, so noise generated by the heat sink 80 may be reduced to less than a certain level.

Figure 7:
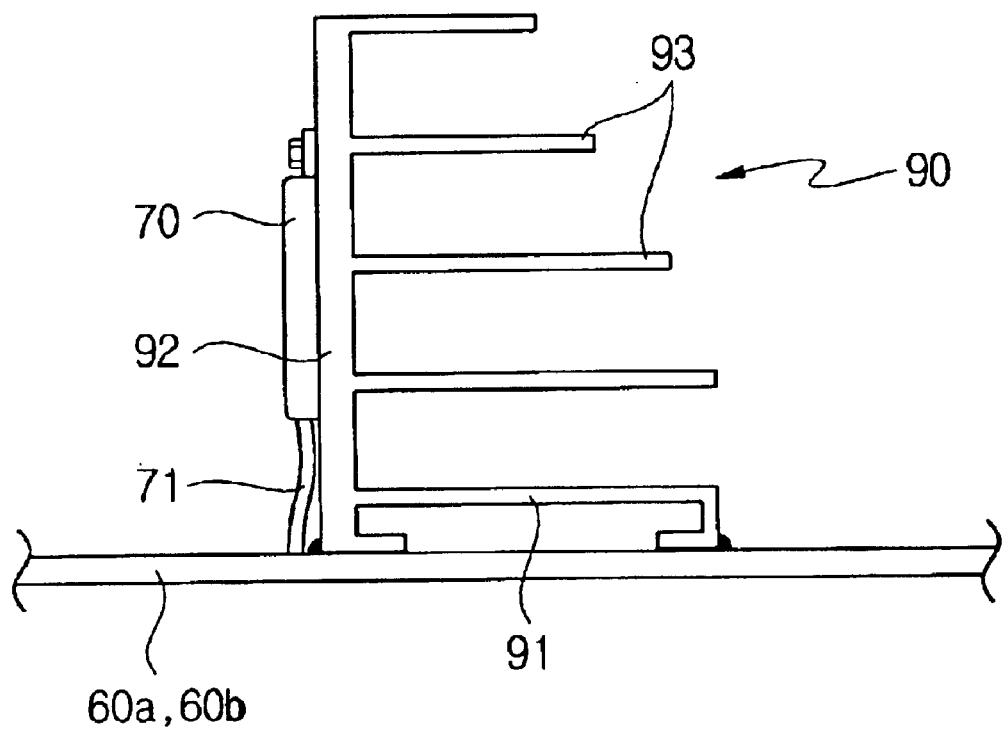
FIG. 7 is a plan view showing the heat sink and the circuit board equipped with the heat sink according to another illustrative, non-limiting embodiment of the present invention.

Furthermore, although in this illustrative, non-limiting embodiment the central and lowermost heat radiation fins 83b and 83c are designed to have the same width. the widths of the heat radiation fins 83a, 83b and 83c could be designed to be inversely proportional to the distances thereof from the base portion 91 as illustrated in FIG. 7.

Hereinafter, operations and effects of the heat sink for electronic devices, and circuit board and PDP assembly, each equipped with the heat sink are described in detail with reference to the accompanying drawings.

A plurality of MOSFETs 70 provided on the X and Y circuit boards 60a and 60b generate heat and vibration by their on/off switching operation. Generated heat is transmitted to the heat sink 80 and dissipated to the air through the heat sink 80, so the overheating of the MOSFFTs 70 can be prevented.

Vibration generated in the MOSFETs 70. along with the heat is transmitted to the heat sink 80, and the heat radiating fins 83a, 83b and 83c provided in the heat sink 80 are vibrated by the vibration transmitted from the MOSFET 70.

In this case, the base portion 81 of the heat sink 80 is fixedly attached to the circuit boards 60a and 60b, so the heat radiation fins 83a, 83b or 83c vibrate with a magnitude that is proportional to the distance between the heat radiation fins 83a, 83b or 83c and the base portion 81 of the heat sink 80.

Figure 6:
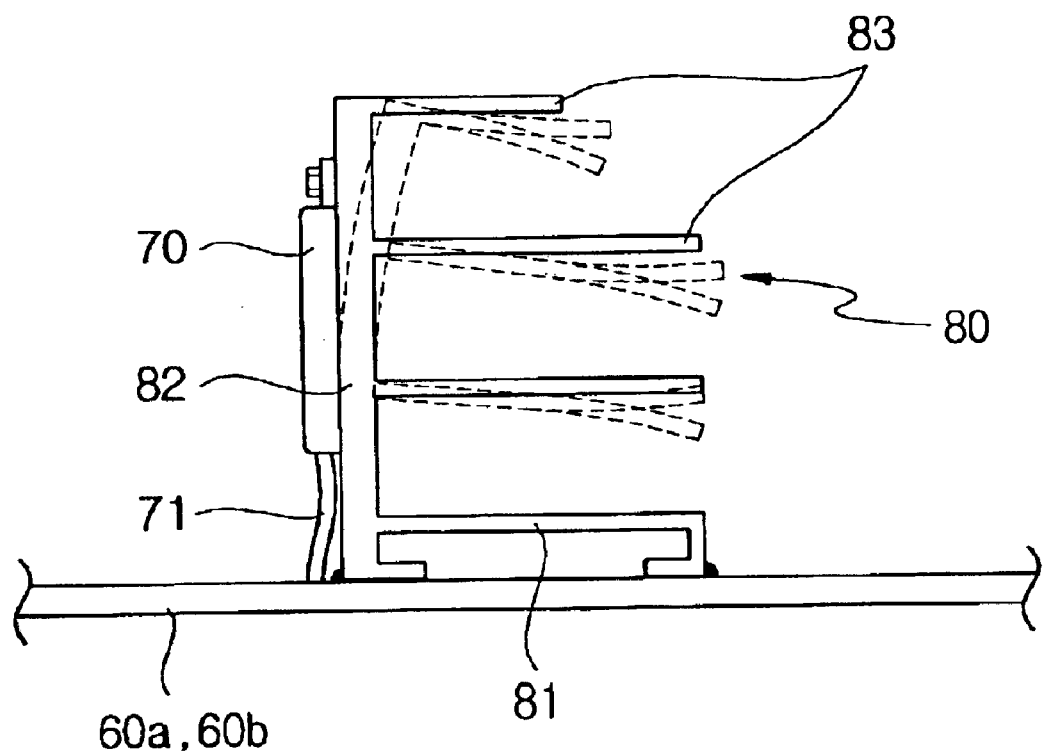
FIG. 6 is a plan view showing the heat sink and the circuit board equipped with the heat sink according to an exemplary embodiment of the present invention.

Since the width L2 of the uppermost heat radiation fin 83a that is most distant from the base portico 81 is designed to be smaller than the width L1 of the central and lowermost heat radiation fins 83b and 83c, the vibration magnitude of the uppermost heat radiation fin 83a is rendered similar to the vibration magnitude of the central and lowermost heat radiation fins 83b and 83c, as depicted in FIG. 6, thus preventing the occurrence of noise.

Figure 8:
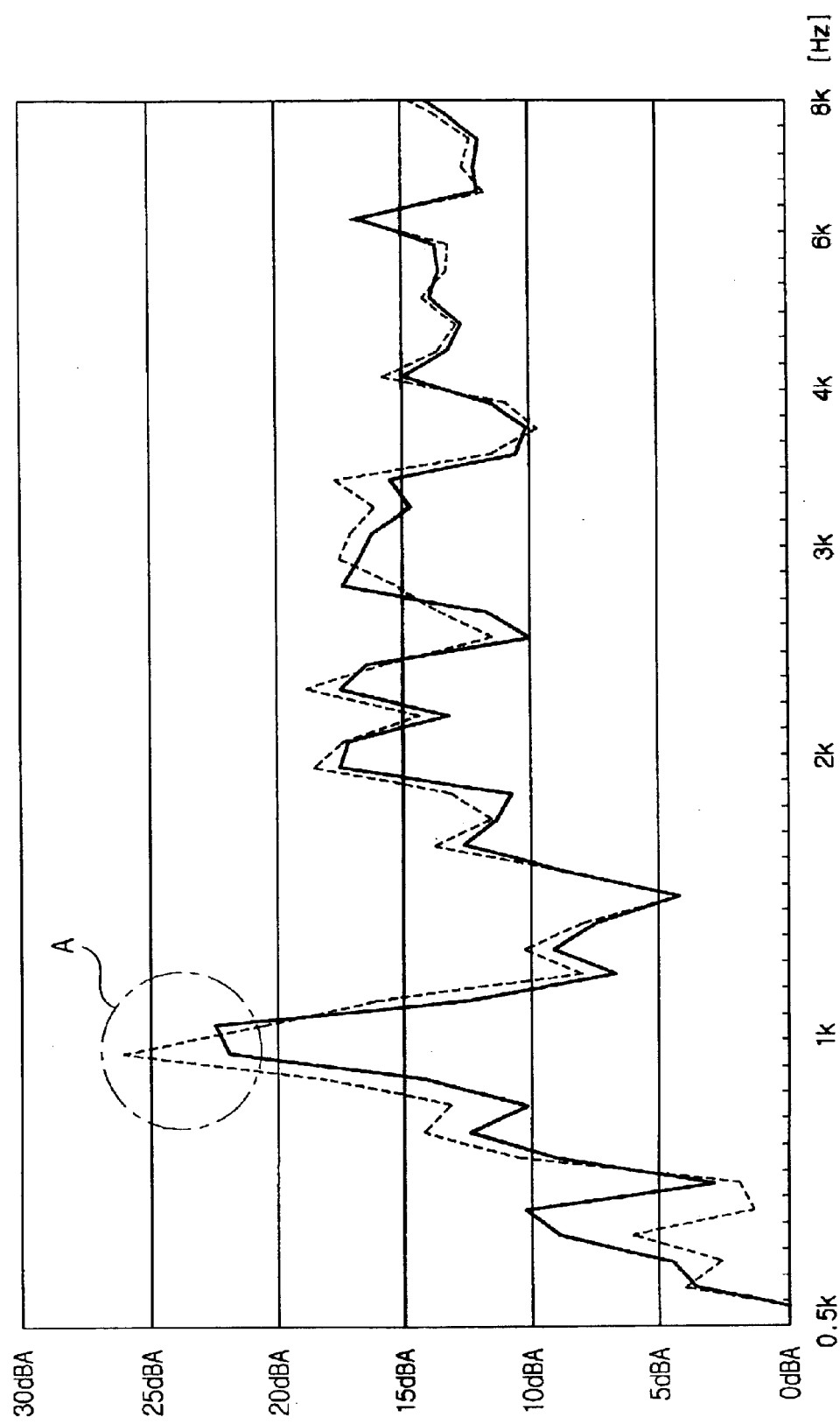
FIG. 8 is a graph showing a comparison of the noise generated by the conventional heat sink and thie heat sink of an exemplary embodiment of the present invention.

FIG. 8 is a graph that illustrates the noise of a conventional heat sink that has three heat radiation fins each with the same width compared to the noise of the heat sink of the present invention in which the width L2 of the uppermost fin 83a is designed to be less than the width L1 of the central and lowermost fins 83b and 83c.

In FIG. 8, a solid line represents the experimental values of the noise of the heat sink 80 of the present invention, while a dotted line represents the experimental values of the noise of the conventional heat sink 80.

As illustrated in portion "A" of FIG. 8, the peak value of the noise of the heat sink of the present invention is reduced to a value that is considerably smaller than the peak value of the noise of the conventional heat sink.

As described in detail above, when a vibration is transmitted from the MOSFET, the heat radiation fins of the heat sink of the present invention are designed to have widths so that the vibration magnitudes of the heat radiation fins are restricted to less than a certain level. Accordingly, noise that may be caused by vibration can be reduced.

Furthermore, as the noise generated in the heat sink is reduced, noise that may be generated in the circuit board and the PDP panel, each equipped with the heat sink of the present invention can be reduced.

Although a few exemplary embodiments of the present invention have been shown and described, it would be appreciated by those skilled in the art that changes may be made in these non-limiting embodiments without departing from the principles and spirit of the invention, the scope of which is defined in claims and their equivalents.

What is claimed is:

1. A heat sink for electronic devices, comprising:
   a base portion attached to a circuit board;
   a contact portion where one or more electronic devices are attached; and
   a plurality of heat radiation fins each extended from the contact portion to a certain distance,
   wherein at least one of the heat radiation fins distant from the base portion has a width shorter than that of a heat radiation fin nearer to the base portion.

2. The heat sink for electronic devices as set forth in claim 1, wherein one of the plurality of heat radiation fins is attached to the circuit board and constitutes the base portion.

3. The heat sink for electronic devices as set forth in claim 1, wherein the contact portion is extended from the base portion to form a certain angle with the base portion, and the plurality of heat radiation fins are extended from the contact portion to be parallel to the base portion.

4. The heat sink for electronic devices as set forth in claim 1, wherein a heat radiation fin spaced from the base portion by more than a predetermined distance has a width shorter than that of a heat radiation fin situated within the predetermined distance.

5. The heat sink for electronic devices as set forth in claim 1, wherein each one of the heat radiation fins has a width inversely proportional to a distance thereof from the base portion.

6. The heat sink for electronic devices as set forth in claim 1, wherein the electronic devices are Metal-Oxide Semiconductor Field Effect Transistors (MOSFETs).

7. A circuit board equipped with a heat sink, the heat sink being brought into contact with one or more electronic devices generating heat and noise to dissipate the heat, the heat sink comprising:
   a base portion fixedly attached to a circuit board;
   a contact portion fixedly brought into contact with one or more electronic devices; and
   a plurality of heat radiation fins each extended from the contact portion to a certain distance,
   wherein a heat radiation fin distant from the base portion has a width shorter than that of a heat radiation fin nearer to the base portion.

8. The heat sink for electronic devices as set forth in claim 7, wherein one of the plurality of heat radiation fins is fixedly attached to the circuit board and constitutes the base portion.

9. The heat sink for electronic devices as set forth in claim 7, wherein the contact portion is extended from the base portion to form a certain angle with the base portion, and the plurality of heat radiation fins are extended from the contact portion to be parallel to the base portion.

10. The heat sink for electronic devices as set forth in claim 7, wherein a heat radiation fin spaced from the base portion by more than a predetermined distance has a width shorter than that of a heat radiation fin situated within the predetermined distance.

11. The heat sink for electronic devices as set forth in claim 7, wherein each one of the heat radiation fins has a width inversely proportional to a distance thereof from the base portion.

12. The heat sink for electronic devices as set forth in claim 7, wherein the electronic devices are MOSFETs.

13. A plasma display panel assembly equipped with a heat sink, the heat sink being brought into contact with one or more electronic devices generating heat and noise to dissipate the heat, the heat sink and the electronic devices being mounted on one or more circuit boards, the heat sink comprising:
   a base portion fixedly attached to a circuit board;
   a contact portion fixedly brought into contact with one or more electronic devices; and
   a plurality of heat radiation fins each extended from the contact portion to a certain distance,
   wherein a heat radiation fin distant from the base potion has a width shorter than that of a heat radiation fin nearer to the base portion.

14. The heat sink for electronic devices as set forth in claim 13, wherein one of the plurality of heat radiation fins is fixedly attached to the circuit board and constitutes the base portion.

15. The heat sink for electronic devices as set forth in claim 13, wherein the contact portion is extended from the base portion to form an angle with the base portion, and the plurality of heat radiation fins are extended from the contact portion to be parallel to the base portion.

16. The heat sink for electronic devices as set forth in claim 13, wherein a heat radiation fin spaced from the base portion by more than a predetermined distance has a width shorter than that of a heat radiation fin situated within the predetermined distance.

17. The heat sink for electronic devices as set forth in claim 13, wherein each one of the heat radiation fins has a width inversely proportional to a distance thereof from the base portion.

18. The heat sink for electronic devices as set forth in claim 13, wherein the electronic devices are MOSFETs.

19. The heat sink for electronic devices as set forth in claim 15, wherein the contact portion is extended from the base portion to form a ninety-degree angle with the base portion.

20. The heat sink for electronic devices as set forth in claim 13, wherein the widths of the plurality of heat radiation fins are determined so that each of the vibration amplitudes of the heat radiation fins are less than a certain level.

21. The heat sink for electronic devices as set forth in claim 13, wherein at least two radiation fins have the same width.

* * * * *